United States Patent [19]

Flamm et al.

[11] Patent Number: 5,111,362

[45] Date of Patent: May 5, 1992

[54] ENCLOSURE ASSEMBLY WITH TWO IDENTICAL COVERS HAVING MODIFIABLE SUPPORTS FOR ASYMMETRICALLY HOUSING A PRINTED CIRCUIT BOARD OR THE LIKE

[75] Inventors: Ronald C. Flamm, Newberg; Leonard O. Turner, Beaverton; James D. Plunkett, Portland, all of Oreg.

[73] Assignee: Intel Corporation, Santa Clara, Calif.

[21] Appl. No.: 584,190

[22] Filed: Sep. 18, 1990

[51] Int. Cl.⁵ ............................ H05K 5/02; B65D 6/00
[52] U.S. Cl. ............................ 361/395; 361/399; 220/4.02; 220/4.24
[58] Field of Search ............ 220/4.02, 4.21, 4.24; 174/16.1, 52.1, 92; 361/383, 384, 395, 399, 424; 200/303, 306; 165/80.3

[56] References Cited

U.S. PATENT DOCUMENTS

| | | | |
|---|---|---|---|
| 3,264,534 | 8/1966 | Murphy | 174/16.1 X |
| 3,407,869 | 10/1968 | Staunton | 174/16.1 X |
| 3,407,961 | 10/1968 | Box | 220/4.24 X |
| 3,631,299 | 12/1971 | Meyer et al. | 361/399 |
| 3,952,903 | 4/1976 | Sanders et al. | 220/4.24 |
| 4,652,969 | 3/1987 | Stegenga | 220/4.24 X |
| 4,664,254 | 5/1987 | Sitwell et al. | 220/4.24 X |
| 4,695,925 | 9/1987 | Kodai et al. | 361/395 |
| 4,700,275 | 10/1987 | Wood | 361/395 X |
| 4,840,286 | 6/1989 | Heberling et al. | 361/383 X |
| 4,889,542 | 12/1989 | Hayes | 361/384 X |
| 4,916,575 | 4/1990 | Van Asten | 361/399 X |
| 4,918,572 | 4/1990 | Tarven et al. | 361/395 |
| 4,958,259 | 9/1990 | Berg et al. | 361/395 X |
| 5,002,493 | 3/1991 | Brown et al. | 361/395 X |
| 5,054,418 | 10/1991 | Thompson et al. | 220/4.21 |

Primary Examiner—Leo P. Picard
Assistant Examiner—Michael W. Phillips
Attorney, Agent, or Firm—Blakely, Sokoloff, Taylor & Zafman

[57] ABSTRACT

A rigid enclosure for printed circuit boards that utilizes identical top and bottom covers and provides for offsetting the distance the printed circuit board sits from the bottom cover. The enclosure utilizes features formed into the covers to provide for alignment and fastening. Removable vents provide for air flow to cool the printed circuit board and when removed, allow access for interface to the printed circuit board. Threaded inserts and standoffs provide flexibility for fastening identical parts together.

10 Claims, 4 Drawing Sheets

FIG_1

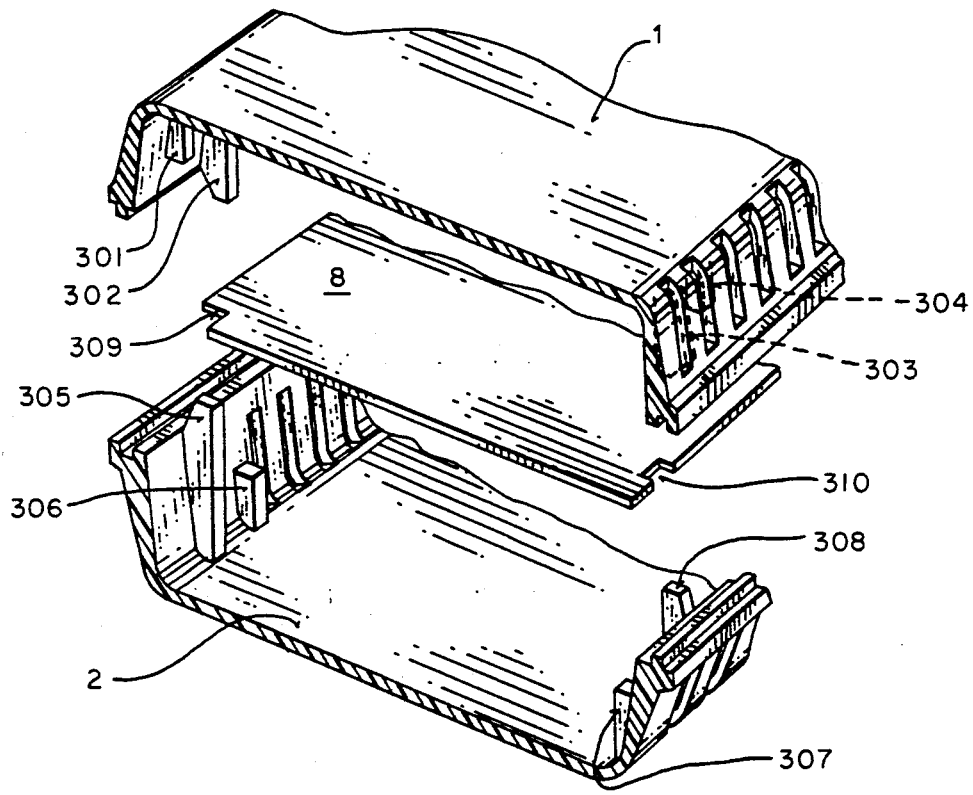
FIG_3
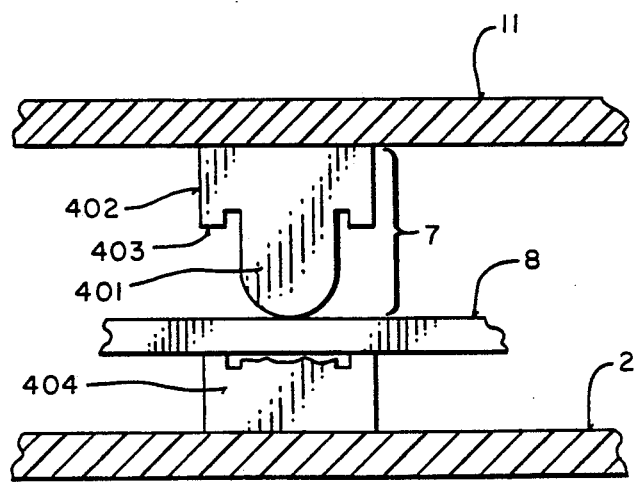
FIG_4

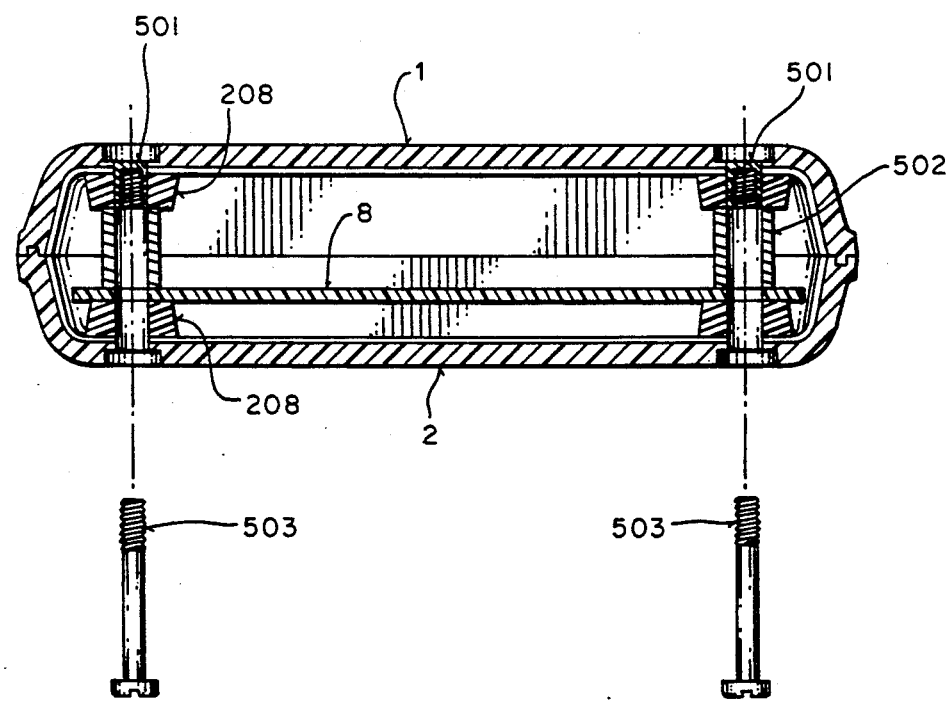
FIG_5

ENCLOSURE ASSEMBLY WITH TWO IDENTICAL COVERS HAVING MODIFIABLE SUPPORTS FOR ASYMMETRICALLY HOUSING A PRINTED CIRCUIT BOARD OR THE LIKE

BACKGROUND OF THE INVENTION

1. Field of the Invention

This invention relates to the field of rigid enclosures for printed circuit boards.

2. Prior Art

Prior enclosures of printed circuit boards (PCB) have unique and separate top and bottom portions and require the PCB to be mounted at a fixed location. A common name for such enclosures is card carriers. The PCBs that are used with these types of enclosures provide electrical connections through pin and socket connection systems or other similar means located on one end of the PCB. One end of the enclosure defines openings which allow for providing an electrical connection to the PCB.

The enclosure is often built after the PCB is designed. Enclosures designed after the PCB are usually custom built to the dimensions of the PCB. Early enclosure designs provided for a top portion of the enclosure to be of a different design than a bottom portion. However, more recent designs having the top and bottom portions identical are available and are motivated by a desire to reduce the manufacturing costs of the enclosure.

In prior enclosures, the enclosure design dictates that the PCB is positioned symmetrically inside the enclosure, i.e. it will lie in the middle of the enclosure rather than closer to the top or bottom portion. The ability to locate the PCB closer to the bottom enclosure allows the use of larger components on the PC board. Conversely, the inability to locate near the bottom of the enclosure places unnecessary constraints on the height of the components that may be used on the PCB or require that a custom enclosure be designed.

It is an object of the present invention to provide a versatile PCB enclosure with identical top and bottom portions that allows asymmetrical positioning of PCBs in the enclosure, thus providing added flexibility in the design of PCBs.

PCB enclosures are used for products that have a wide variety of applications. For example, in the preferred embodiment the PCB enclosure can be used for a product that aids in monitoring the physical characteristics of an electrical circuit (i.e. an in-circuit debugger.) Another example is an external modulator/demodulator (modem) used for electrically connecting personal computer systems over telephone lines. Any product that uses electrical circuits and can be designed to operate on a single PCB may utilize a PCB enclosure.

SUMMARY OF THE INVENTION

An improved printed circuit board enclosure is disclosed. In its preferred embodiment, the enclosure system contains five primary parts; a top cover, a bottom cover, a front panel, removable vents and fastening means. Means for alignment and locating the distance of the PCB from the bottom cover are formed directly into the top and bottom covers. Prior to assembly, the top and bottom covers are identical. Upon assembly, the height adjustment posts found in the bottom cover, may be altered.

The invention discloses several important features including the use of identical top and bottom covers and means to locate the PCB asymmetrically within the covers for a particular application. These features provide the benefit of reducing any height constraints on the use of components when designing PCBs and reduce the need to design custom enclosures for PCBs.

BRIEF DESCRIPTION OF THE DRAWINGS

FIG. 3 is a cutaway view of the back-end side of the covers as may be utilized by the present invention.

FIG. 4 is a detail view of a height adjustment post as may be utilized by the present invention.

FIG. 5 is a cutaway view of a fastening means as may be utilized by the present invention.

DETAILED DESCRIPTION OF THE PRESENT INVENTION

An enclosure system for housing printed circuit boards (PCBs) is disclosed. In the following description, numerous specific details are set forth to provide a thorough understanding of the present invention. It will be obvious to one skilled in the art that the invention may be employed without these specific details. In other instances, well-known methods and structures have not been set forth in order not to unnecessarily obscure the present invention.

Figure 1:
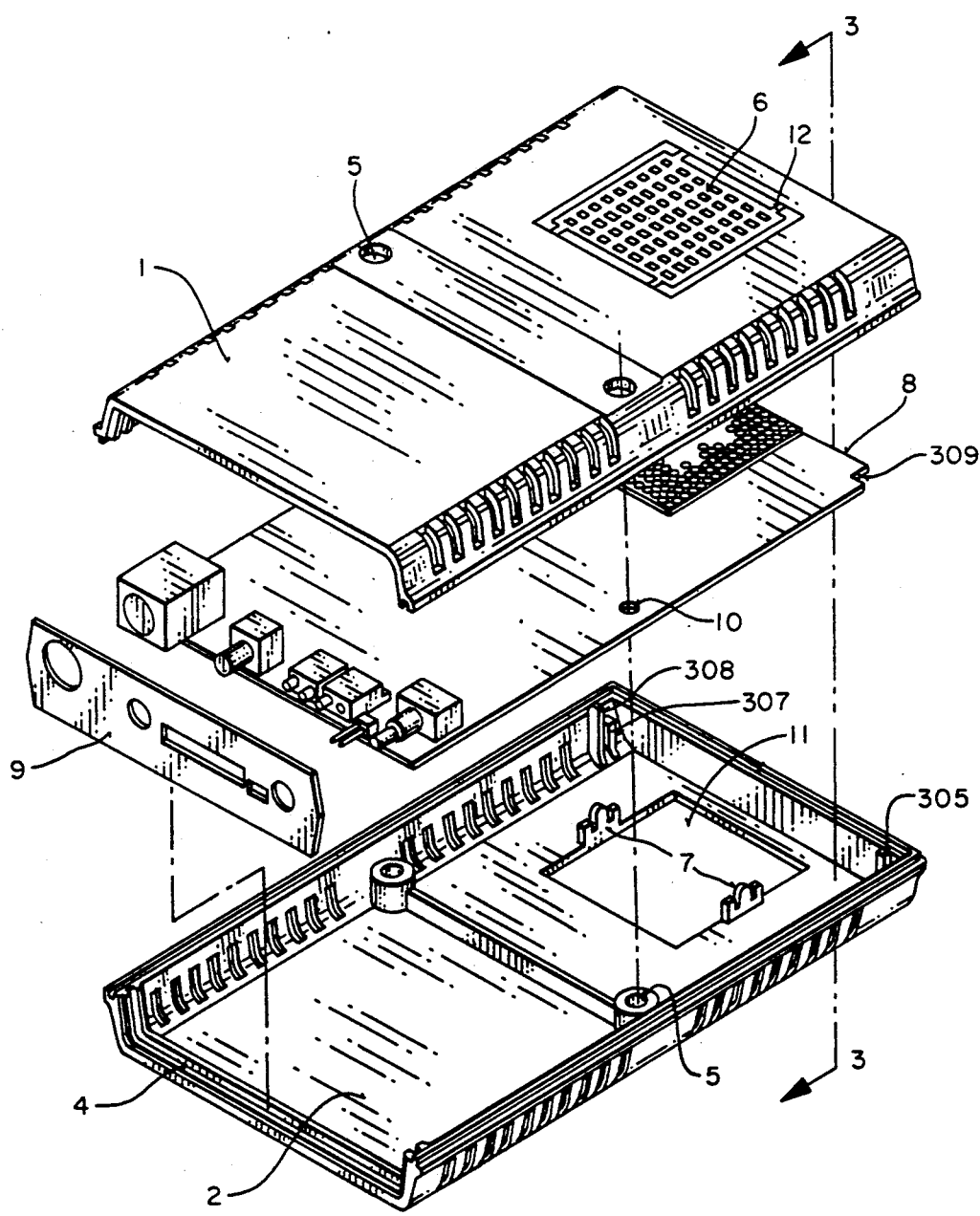
FIG. 1 is an exploded view of a rigid enclosure of the preferred embodiment.

The preferred embodiment of the present invention is illustrated in FIG. 1. The enclosure housing is comprised of a top cover 1 and a bottom cover 2. Prior to assembly, the top cover 1 and bottom cover 2 are identical; each forming molded long ribs 308 and 305, molded short ribs 307 and 306 (not visible in FIG. 1), front panel ribs 4, fastener holes 5, removable vents 6 and support posts 7. Also shown in FIG. 1 are a PCB 8 and a front panel 9. In the preferred embodiment the solder side of the PCB 8 faces downward while the component side faces upward. PCB 8 is illustrative of a PCB that could utilize the present invention. Alternative embodiments could utilize a PCB with different connection means and a corresponding front panel with a different number of connection holes defined.

The front panel 9 is roughly rectangular in shape. As illustrated in FIG. 1, the front panel 9 defines five (5) thru holes for providing access to connection means located on the PCB 8. Alternative embodiments may have the front panel 9 defining a different number of thru holes without departing from the spirit and scope of the present invention. The front panel 9 is positioned within the enclosure by the previously described front panel ribs 4 found on the top cover 1 and bottom cover 2. When assembled, the front panel 9 is inserted into a space defined by a pair of front panel ribs 4. The thickness of the front panel 9 roughly corresponds to the space defined by the front panel ribs 4. Thus, when the front panel 9 is inserted into the space defined by the front panel ribs 4, a secure fit is obtained. When the top cover 1 and bottom cover 2 are fastened together, the front panel 9 is fixed in a stationary position by the front panel ribs 4. In the preferred embodiment, the front panel 9 is constructed of aluminum and has the dimensions 0.750"×3.500"×0.062" thick.

Figure 2:
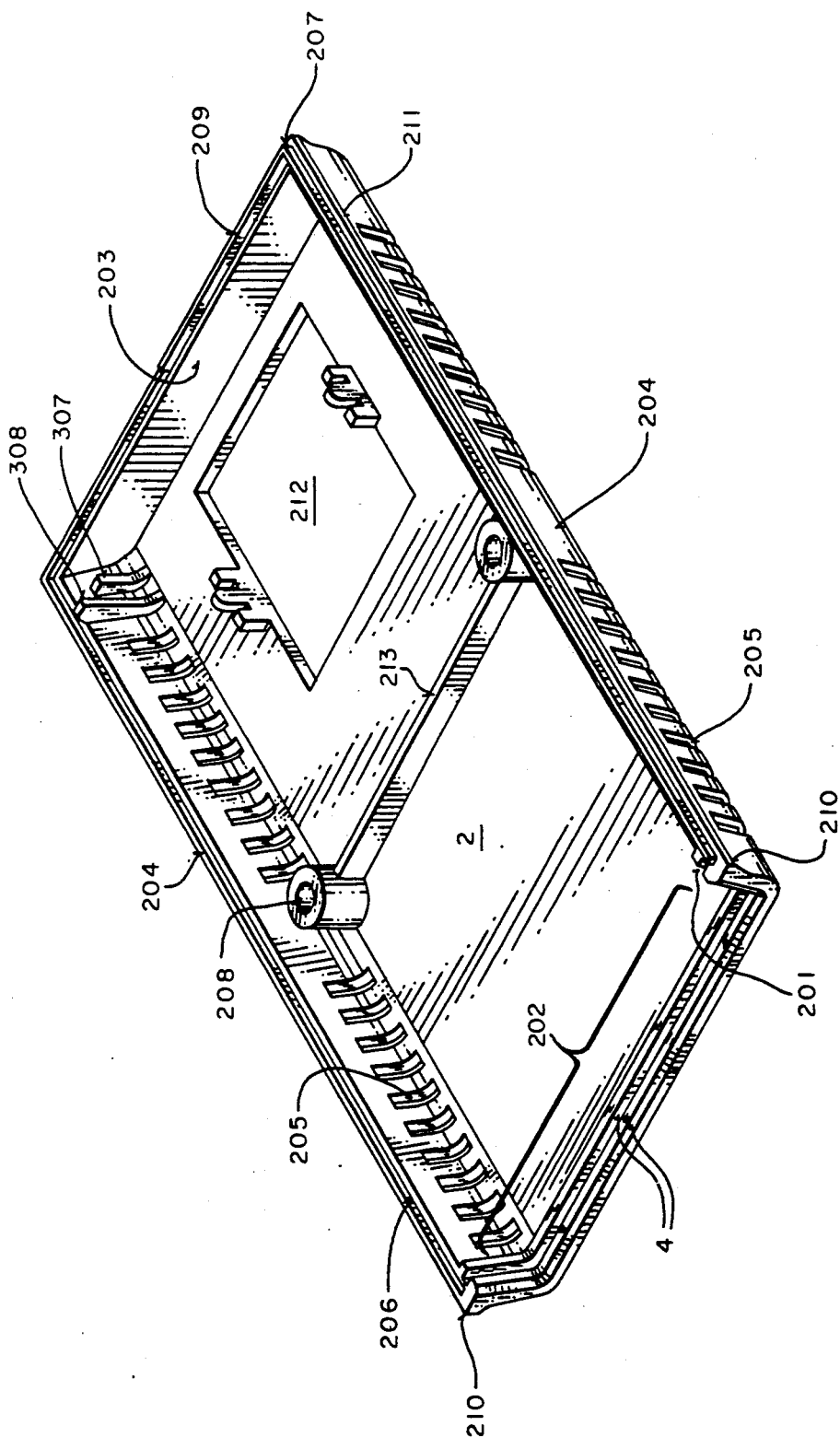
FIG. 2 is a detailed view of a single cover as may be utilized by the present invention.

FIG. 2 illustrates the details of a cover 201. As the top and bottom covers of the preferred embodiment are of identical construction, the cover 2 may be representative of either top cover 1 or bottom cover 2 shown in FIG. 1. In the preferred embodiment, the cover 201 has rectangular dimensions of 4.00"×6.50" and is constructed of plastic. It would be obvious to one skilled in the art, that different dimensions could be utilized without departing from the spirit and scope of the invention. An alternative embodiment may use metal cast materials to incorporate the described features.

The front end 202 of the cover 201 creates an opening where the front panel ribs 4 are defined. As will be described later, the front panel ribs 4 are used to align and position the front cover 9. In the preferred embodiment, two front panel ribs 4 are defined by the cover 201. The front panel ribs 4 are approximately 0.080" in width, 0.050" in height and are spaced 0.062" apart. It would be obvious to one skilled in the art, that a different number of front panel ribs or different height, width or spacing could be defined by the cover 201, without departing from the spirit and scope of the present invention.

The back end 203 forms a curved "L" shaped back and defines a lip 209 at its end. The sides 204 also form a curved "L" shape and define a lip 210 at their end. In the preferred embodiment, the height of the "L" shaped back and sides 203, 204 is 0.550". At the point of curvature of the sides 204, ventilation slots 205 are formed. In the preferred embodiment there are ten (10) ventilation slots formed per side in the front end and nine (9) ventilation slots formed per side in the back end. The dimensions of the ventilation slots 205 are 0.125"×0.350". It would be obvious to one skilled in the art that the number of ventilation slots per side as well as the location and dimensions of the ventilation slots could vary without departing from the spirit and scope of the present invention.

Within the side lip 210, alignment means are defined for aligning the top cover 1 with the bottom cover 2 (see FIG. 1). In the preferred embodiment, the side lip 210 of the cover 201 defines a lengthwise groove 206 and the side lip 211 defines a lengthwise tongue 207. The tongue and groove on side lips 209 and 210 meet approximately half way along the width of cover 201. When assembled a tongue side of bottom cover 2 will be lined up with a matching groove side of top cover 1. Conversely, a tongue side of top cover 1 will be lined up with a matching groove side of bottom cover 2. When the top cover 1 is fastened to the bottom cover 2, a tongue side is inserted into a groove side thus providing alignment for the covers and adding stability to the enclosure. It would be obvious to one skilled in the art that reversing the placement of the tongue and groove on the opposite lips and that alternative methods for fastening, e.g. utilizing a post and a post hole located within the lip, could be employed without departing from the spirit and scope of the present invention.

Screw guides 208 are formed on the inner surface of the cover 201. The fastening holes 5 illustrated in FIG. 1, are formed extending through the screw guides 208. The fastening means are described in more detail below. A bridge 213 is formed joining the two screw guides 208. The bridge 213 provides support and rigidity to the enclosure structure. In the preferred embodiment the height of the bridge 213 is 0.062" and the width is 0.075", the diameter of the fastening hole 5 is 0.150", and the height of screw guide 208 is 0.200".

The cover 201 has a vent 6 which occupies an opening with dimensions 1.75"×1.75". As illustrated in FIG. 1, the vent 6 defines a plurality of openings across it's surface. In the preferred embodiment, the vent 6 defines 88 opening in a 8×11 matrix pattern. The dimension of each opening is 0.070"×0.120". Vent 6 is initially molded as part of the top and bottom covers and may be removed by cutting tabs 12 which provides an opening in the bottom cover. When the vent 6 remains in the cover 201, vent 6 provides for circulation of air onto the enclosed PCB 8 and prevents inadvertent or undesired contact with the PCB 8, from outside the enclosure housing. When vent 6 is removed from the cover 201, an opening is provided which allows interface with the PC board inside. In the preferred embodiment, removable vent 6 is square in shape and has the dimensions 1.600"×1.600" and is constructed of plastic. Alternative embodiments of different shapes, construction or fastening means would be obvious to one skilled in the art and would not depart from the spirt and scope of the invention.

FIG. 3 is a cut-away view of the back-end 203 of the present invention. The top cover 1 forms molded ribs 301-304. The bottom cover 2 forms molded ribs 305-308. In the preferred embodiment, two types of molded ribs are formed; long ribs (302, 303, 305, 308) and a short ribs (301, 304, 306, 307). Orienting FIG. 3 from a viewer's perspective, the molded ribs are formed so that on the left side of the top cover 1, the short rib 301 is the forward rib and the long rib 302 is the back rib while on the right side the long rib 303 is the forward rib and the short rib 304 is the back rib. Conversely, on the left side of bottom cover 2 the long rib 305 is the forward rib and the short rib 306 is the back rib while on the right side, short rib 307 is the front rib and long rib 308 is the back rib. Thus, when a top cover 1 is assembled with a bottom cover 2, a long rib will be aligned with a short rib. Also notable is that if top cover 1 was turned upside-down, top cover 1 would have the identical rib orientation as bottom cover 2, thus aiding the ability to use identical covers.

Rectangular notches 309, 310 formed by the PCB 8 define clearance thruways for the long ribs 305, 308 formed by bottom cover 2. The rectangular notches 309, 310 are of the dimensions 0.10"×0.12" which are roughly equivalent to the dimensions of the long rib 302. Notch 309 is defined on the left corner end of the PCB 8 and the notch 310 is defined on the right side approximately 0.20" from the end. When assembled, the long rib 305 of the bottom cover 2 will extend through the notch 309 and the long rib 308 will extend through notch 310 thus providing alignment and stability for the PCB 8 when it is in the enclosure. The long ribs 305, 308 of the bottom cover act as stops for keeping the PCB 8 in place within the enclosure. The long ribs 302, 303 of the top cover 1 work with the corresponding short ribs 306, 307 of the bottom cover 2 to pinch the PCB 8 and provide support. In the preferred embodiment the dimensions of the long ribs 302, 303, 305, 308 are 0.075"×0.125"×0.575" and the dimensions of the short ribs 301, 304, 306, 307 are 0.075"×0.125"×0.215". The front ribs 301, 303, 305, 307 are defined 0.250" from the back-end. The back ribs 302, 304, 306, 308 are defined 0.475" from the back-end and 0.225" from a front rib. It would be obvious to one skilled in the art that increasing the number of ribs or varying the length would not depart from the spirt and scope of the present invention.

FIG. 4 is a cross sectional view of a support post 7 in an assembled enclosure. As illustrated in FIG. 1, in the preferred embodiment the posts 7 are formed adjacent to the vent hole 11. The support posts 7 are used to support a PCB 8 adjacent to opening 11. Referring back to FIG. 4, the support posts 7 have a rectangular shaped base with surface posts 403 on each side. A dome shaped protrusion 401 extends from the middle of the base 402 between and extending above the surface posts 403. The unmodified support post 7 is shaped like the top half of the letter "H" with a dome extended past the top legs of the "H".

Support posts 7 are initially molded with the dome 401 in the top cover 1 and bottom cover 2. A modified support post 404 is created when the dome shaped protrusion 401 is removed. The support posts 7 are constructed so that the dome shaped protrusion 401 can be removed, for example by breaking it away, without damaging the surface posts 403 or the base 402. The removal is done upon assembly. When the support post 7 is not modified, the PCB 8 sits atop the domed shaped protrusion 401. When the support post 7 is modified, the PCB 8 sits atop the domed surface posts 403. In the preferred embodiment the height of the unmodified support post is 0.550", the dimension of the base is 0.190", the height of the surface posts are 0.360" and its thickness is 0.060". It would be obvious to one skilled in the art that a support post could be located elsewhere on the cover as required for PCB support or that the support posts can be of different dimensions.

FIG. 5 illustrates the means for fastening top cover 1 with bottom cover 2 and PCB 8 when the PCB 8 does not sit on the center horizontal plane of the enclosure. A threaded insert 501 is placed in each of the screw guides 208 of the top cover 1. The threaded insert 501 provides a termination point for the screws used by the fastening means. A male/female threaded standoff 502 is placed between the fastening holes 10 defined by PCB 8 (as shown in FIG. 1) and the screw guide 208 of the top cover 1. The threaded standoff 502 acts as a spacer to accommodate the horizontal positioning of PCB 8 within the enclosure. The threaded standoff 502 and threaded insert 501 provide the means by which fastening can be accomplished and accommodate the PCB offset even though the top and bottom covers are identical. In the preferred embodiment, the threaded standoff 502 and threaded insert 501 are constructed of steel.

Two (2) screws 503 originate in the fastening holes 5 defined by the bottom cover 2 extend through the screw guide 208 of the bottom cover 2, the holes 10 defined by PCB 8, and into the threaded standoff 502. Thus, the top cover 1 may be fastened to the bottom cover 2. It would be obvious to one skilled in the art that alternative means to fasten the top and bottom covers together could be employed, e.g. utilizing posts and post holes, without departing from the scope and spirit of the present invention. In the preferred embodiment two (2) #6 screws are utilized.

Thus, an improved enclosure for printed circuit boards has been described. Utilizing identical top and bottom covers to stabilize and asymmetrically position the PCB, the enclosure can accommodate PCBs with a wide range of component types and sizes.

We claim:

1. An enclosure assembly for asymmetrically positioning a printed circuit board within said enclosure assembly, said enclosure assembly comprised of:
a first molded cover and a second molded cover of identical construction, said first molded cover and second molded cover defining modifiable support means, said modifiable support means including a breakaway portion, for supporting and asymmetrically positioning a printed circuit board in a first in position after modifying said modifiable support means by removing said breakaway portion on said first molded cover or a second position after modifying said modifiable support means by removing said breakaway portion on said second molded cover within said enclosure assembly;
a front panel coupled to said first molded cover and said second molded cover; and fastening means fastening said first cover with said second cover.

2. The enclosure assembly as recited in claim 1, wherein each of said first cover and said second cover of identical construction further defines:
a first alignment means for aligning a printed circuit board within said enclosure assembly;
a second alignment means for aligning said first molded cover and said second molded cover;
a removable vent; and
a plurality of apertures used to enable fastening said first cover to said second cover.

3. The enclosure assembly as recited in claim 2, wherein said first alignment means is comprised of a plurality of molded ribs.

4. The enclosure assembly as recited in claim 3, wherein said second alignment means is comprised of a tongue and a groove.

5. The enclosure assembly as recited by claim 4, wherein said fastening means is comprised of a plurality of screws.

6. An enclosure assembly comprised of:
a printed circuit board, said printed circuit board defining a plurality of alignment notches, said printed circuit boarding being asymmetrically positioned within said enclosure assembly;
a top cover coupled with a bottom cover of identical construction, each of said top cover and said bottom cover defining:
(a) a plurality of molded ribs coupling with said plurality of notches defined by said printed circuit board; and
(b) a modifiable support means, said modifiable support means including a breakaway portion, for supporting and positioning said printed circuit board in a first asymmetric position after modifying said modifiable support means by removing said breakaway portion on said first molded cover or in a second asymmetric position after modifying said modifiable support means by removing said breakaway portion on said second molded cover; and
fastening means fastening said top cover with said bottom cover.

7. In an enclosure for an electrical device, said electrical device to be coupled to one or more other electrical devices, an improvement comprising:
a top cover and a bottom cover of identical construction, said top cover and said bottom cover each defining modifiable means, said modifiable support means including a breakaway portion, for positioning an electrical device in a first asymmetrical position after modifying said modifiable support means by removing said breakaway portion on said first molded cover or in a second asymmetrical position after modifying said modifiable support means by removing said breakaway portion on said second molded cover within said enclosure; and
means fastening said top cover with said bottom cover.

8. An enclosure assembly for asymmetrically positioning a printed circuit board within said enclosure assembly comprised of:

a) a first molded cover and a second molded cover of identical construction, said first molded cover coupled to said second molded cover, each of said first molded cover and said second molded cover of identical construction defining:

modifiable support means said modifiable support means including a breakaway portion, for supporting a printed circuit board within said enclosure assembly in a first asymmetrical position after modifying said modifiable support means by removing said breakaway portion on said first and molded cover or in a second asymmetric position after modifying said modifiable support means by removing said breakaway portion on said second molded cover;

a first alignment means for aligning said printed circuit board within said enclosure assembly, said first alignment means comprised of a plurality of molded ribs;

a second alignment means aligning said first molded cover and said second molded cover; and a plurality of apertures used to enable fastening said first cover to said second cover;

b) a front panel coupled to said first molded cover and said second molded cover; and c) fastening means fastening said first cover with said second cover.

9. The enclosure assembly as recited in claim 8, wherein said second alignment means is comprised of a tongue and a groove.

10. The enclosure assembly as recited by claim 9, wherein said fastening means is comprised of a plurality of screws.

* * * * *

UNITED STATES PATENT AND TRADEMARK OFFICE
CERTIFICATE OF CORRECTION

PATENT NO. : 5,111,362
DATED : 5/5/92
INVENTOR(S) : Ronald C. Flamm et al

It is certified that error appears in the above-indentified patent and that said Letters Patent is hereby corrected as shown below:

Col. 2, line 68, delete "2" and insert --201--.

Signed and Sealed this

Fifteenth Day of March, 1994

Attest:

BRUCE LEHMAN

*Attesting Officer*     *Commissioner of Patents and Trademarks*